(12) United States Patent  (10) Patent No.: US 8,595,680 B1
Steinberg  (45) Date of Patent: Nov. 26, 2013

(54) CONSTRAINED RANDOM ERROR INJECTION FOR FUNCTIONAL VERIFICATION

(75) Inventor: Daniel R. Steinberg, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/524,390

(22) Filed: Jun. 15, 2012

(51) Int. Cl.
*G06F 17/50* (2006.01)
*G06F 11/22* (2006.01)
*G06G 7/48* (2006.01)

(52) U.S. Cl.
USPC ............. 716/136; 211/105; 211/209; 703/22

(58) Field of Classification Search
USPC ....................... 716/136; 211/105, 209; 703/22
See application file for complete search history.

(56) References Cited

U.S. PATENT DOCUMENTS

| | | | |
|---|---|---|---|
| 2003/0046053 A1* | 3/2003 | Wheeler et al. ................. | 703/15 |
| 2006/0136190 A1* | 6/2006 | Shibata .......................... | 703/22 |
| 2008/0059747 A1 | 3/2008 | Burckart et al. | |
| 2008/0294814 A1 | 11/2008 | Gorobets | |
| 2010/0175051 A1* | 7/2010 | Tanabe et al. ................. | 717/124 |
| 2010/0257511 A1* | 10/2010 | Hatabu .......................... | 717/131 |
| 2010/0262766 A1 | 10/2010 | Sprinkle et al. | |
| 2010/0287217 A1 | 11/2010 | Borchers et al. | |
| 2012/0079346 A1* | 3/2012 | Fukuda ......................... | 714/758 |
| 2012/0185669 A1* | 7/2012 | Teranishi ...................... | 711/209 |

* cited by examiner

*Primary Examiner* — Jack Chiang
*Assistant Examiner* — Magid Dimyan
(74) *Attorney, Agent, or Firm* — Brake Hughes Bellermann LLP

(57) ABSTRACT

According to one general aspect, a method may include simulating a memory circuit, wherein the memory circuit is configured to store data. The method may also include receiving, by the simulated memory circuit, a memory access operation. The method may further include dynamically determining, in response to the memory access, if, based on a set of predefined criteria, the simulated memory circuit should generate a memory error as the result of the memory access. The method may also include, if the simulated memory circuit is to generate the memory error, generating the memory error as the result of the memory access.

30 Claims, 5 Drawing Sheets

```
//
// Example embodiment of memory model sections
// that call the inject_error function every time the output data changes
//
```

202 —
```
module mem_example(
    input clk,
    input read_en,
    input write_en,
    input [31:0] addr,
    input [31:0] data_in,
    output [31:0] data_out,
    output error
    );
```

204 —
```
//
// <Memory FUB model code here> ...
//
```

206 —
```
// Get and store the module hierarchy string at startup
string module_hierarchy;
initial begin
    module_hierarchy = $psprintf("%m");
end
```

208 —
```
// Every time the data changes, call inject_error function
// to determine if error should be injected
always @(data_out) begin
```

210 —
```
    if (`inject_error(module_hierarchy)) begin
        // Assert error output and randomize data out
        error = 1;
        data_out = $urandom_range(0,32'hFFFFFFFF);
    end
```

```
    else begin
```

212 —
```
        // No error
        error = 0;
        data_out = ...
```

```
    end
end
```

```
endmodule
```

FIG. 3
300

302 —
```
//
// Globally accessible variables to control error injection.
//
int error_time_window_start=1000;
int max_errors=10;
int match_string="test";
real error_prob=1.0;

int tot_errors=0;
int en_string_match=0;
```

304 —
```
// error injection function
function int inject_error(string module_hierarchy);
   real tmp_float;
   bit match=0;
```

306 —
```
   if (en_string_match) begin
      if (module_hierarchy.substr(0,match_string.len()-1) == match_string) begin
         match = 1;
      end
   end
   else begin
      match = 1;
   end
```

308 —
```
   if ((error_prob > 0) &&
       ($time >= error_time_window_start) &&
       (tot_errors < max_errors)) begin
      tmp_float = $urandom_range(0,100000) / 1000.0;
      if (tmp_float <= error_prob) begin
```

310 —
```
         $display ("Injecting Error for module: %0s ...",module_hierarchy);
         tot_errors++;
         return 1;
      end
   end
```

312 —
```
   return 0;
endfunction
```

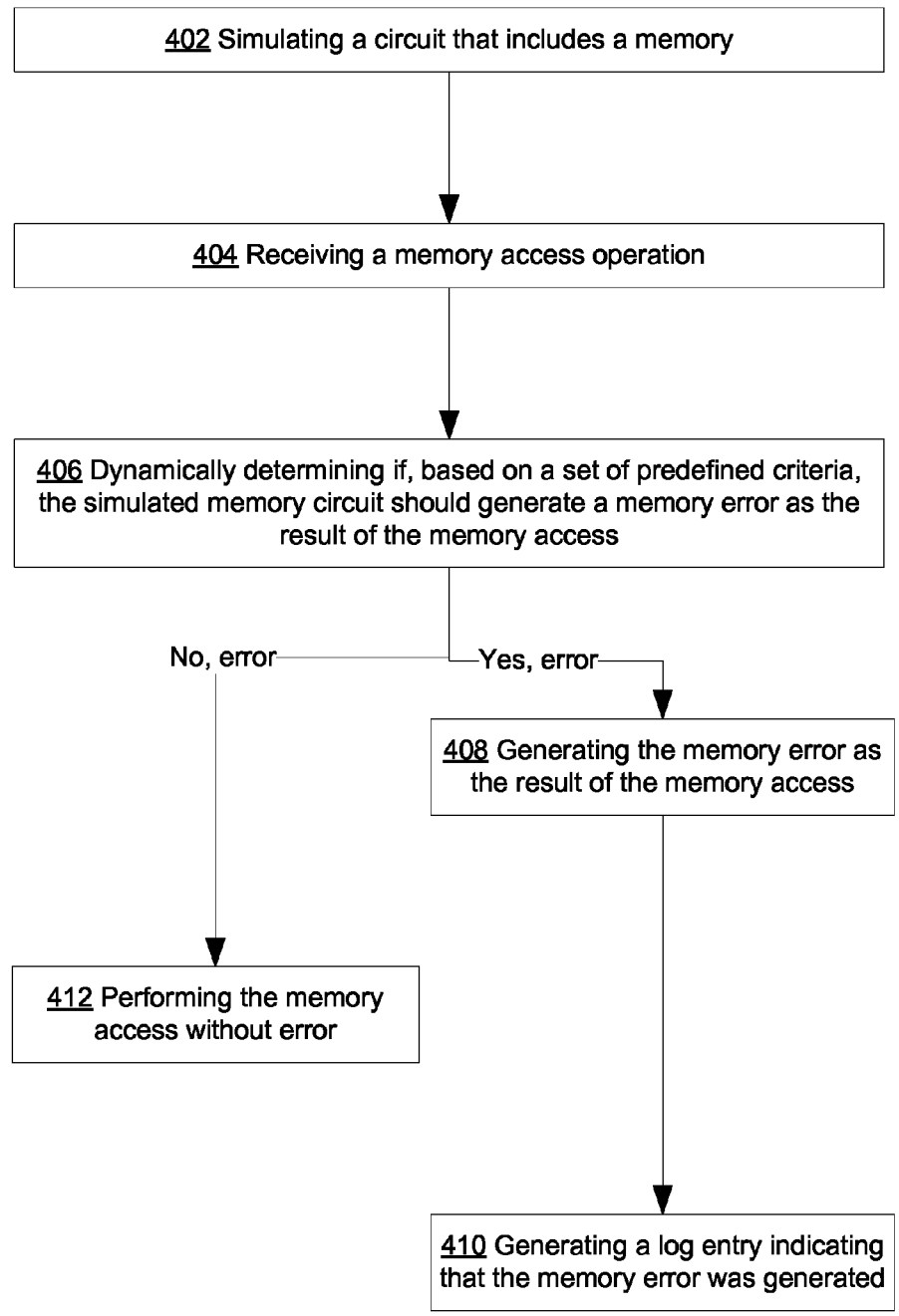

CONSTRAINED RANDOM ERROR INJECTION FOR FUNCTIONAL VERIFICATION

TECHNICAL FIELD

This description relates to the simulation and testing of an electrical circuit and more specifically to the simulation and testing of a memory circuit.

BACKGROUND

In electronics, a hardware description language (HDL) include a computer or modeling language for formally describing and designing electronic circuits, and most-commonly, digital logic. Typically an HDL can describe the circuit's operation, its design and organization, and may even define tests to verify its operation by means of simulation. Often HDLs include standard text-based expressions of the spatial and temporal structure and behavior of electronic systems. In contrast to most software programming languages (e.g., C, Java, JavaScript, etc.), HDLs often include an explicit notion of time, which is a primary attribute of hardware. Two of the more common HDLs include Verilog and VHDL (Very-high-speed integrated circuits Hardware Description Language), although other HDLs exist.

Often HDLs may be compiled into a model of their respective electrical circuits or modules. These models are occasionally referred to as Register-Transfer-Logic (RTL) models. The characteristics and functions of the electrical circuits may then be simulated via the respective RTL models. Often these RTL models are subjected to a series of tests which excite the RTL model by applying various simulated electrical signals to the RTL model and comparing the output of the RTL model to an expected output. Often these tests may also be written in a HDL or another language. Such test are typically part of the functional verification process of design in which it is determined whether or not the electrical circuit (via the RTL model) is likely to function correctly as defined by the design specification. In such an embodiment, it is easier and cheaper to fix design errors in the HDL and RTL model than to fix such errors once the electrical circuit is fabricated into a physical electrical circuit.

Modern digital circuits typically include numerous embedded memories (e.g., processor registers, instruction and data caches, random access memories, non-volatile memories, etc.) that are susceptible to soft errors. In this context, a soft error is an error in a signal or datum which is wrong. Errors may be caused by a defect, usually understood either to be a mistake in design or construction, or a broken component. In this context, a soft error is an error in a signal or datum which is wrong, but is not assumed to imply such a mistake or breakage. After observing a soft error, there is generally no implication that the system or circuit is any less reliable than before. However, while the soft error may not indicate that the circuit is damaged or incorrectly designed, a soft error may result in an incorrect calculation by the processor or larger electronic circuit.

In order to avoid undesirable behavior in the presence of soft errors, error detection (and possibly correction) logic is typically added (e.g., error correcting code, parity generation and checking, etc.). Generally such error detection is integrated or part of modern embedded memory circuits. However, the implementation of the error detection (e.g., output signals etc.) generally varies greatly from memory to memory. This logic tends to be complex, usually added late in the design cycle, and often goes untested as part of functional verification.

Although soft errors are generally rare, the handling of these errors can become critical, and untested parts of the design usually result in designs that have functional defects (a.k.a. bugs). Performing functional simulations of logic that handles soft errors is complex. Directed or targeted test simulations are generally slow, tedious, and, because of this, leaves significant portions of the electrical circuits functionality untested. For example, a tester can manually force an internal error on a specific memory instance and then verify that the appropriate action is taken (e.g., a parity error status bit is set). However, such manual simulation of an error (e.g., by manually forcing an electrical signal to a particular value, etc.) require that each test be manually coded and so tightly coupled with the tested RTL model that changes in the RTL (e.g., a change in the name of a signal, etc.) render the test invalid (e.g., the test may attempt set a signal to a high/low value but the signal may no longer exist, etc.).

SUMMARY

According to one general aspect, a method may include simulating a memory circuit, wherein the memory circuit is configured to store data. The method may also include receiving, by the simulated memory circuit, a memory access operation. The method may further include dynamically determining, in response to the memory access, if, based on a set of predefined criteria, the simulated memory circuit should generate a memory error as the result of the memory access. The method may also include, if the simulated memory circuit is to generate the memory error, generating the memory error as the result of the memory access.

According to another general aspect, an apparatus may include a processor and a storage medium. The processor may be configured to: simulate a memory circuit, wherein the memory circuit is configured to store data, execute a test that causes the simulated memory circuit to receive a memory access operation, dynamically determine, in response to the memory access, if, based on a set of predefined criteria, the simulated memory circuit should generate a memory error as the result of the memory access, and, if the simulated memory circuit is to generate the memory error, generate the memory error as the result of the memory access. The storage medium may be configured to store a plurality of tests, wherein each test causes the processor to simulate a memory access operation on the simulated memory circuit.

According to another general aspect, a computer program product for simulating a circuit may be tangibly and non-transitorily embodied on a computer-readable medium. The computer program may include executable code that, when executed, is configured to cause a hardware simulating apparatus to: simulate a memory circuit, wherein the memory circuit is configured to store data; receive, by the simulated memory circuit, a memory access operation; dynamically determine, in response to the memory access, if, based on a set of predefined criteria, the simulated memory circuit should generate a memory error as the result of the memory access; and if the simulated memory circuit is to generate the memory error, generate the memory error as the result of the memory access.

The details of one or more implementations are set forth in the accompanying drawings and the description below. Other features will be apparent from the description and drawings, and from the claims.

A system and/or method for the simulation and testing of an electrical circuit, substantially as shown in and/or described in connection with at least one of the figures, as set forth more completely in the claims.

BRIEF DESCRIPTION OF THE DRAWINGS

FIG. 2 is a diagram of an example embodiment of code portion for a simulated memory circuit in accordance with the disclosed subject matter.

FIG. 3 is a diagram of an example embodiment of code portion for a simulated memory circuit in accordance with the disclosed subject matter.

FIG. 4 is a flowchart of an example embodiment of a technique in accordance with the disclosed subject matter.

Like reference symbols in the various drawings indicate like elements.

DETAILED DESCRIPTION

Figure 1:
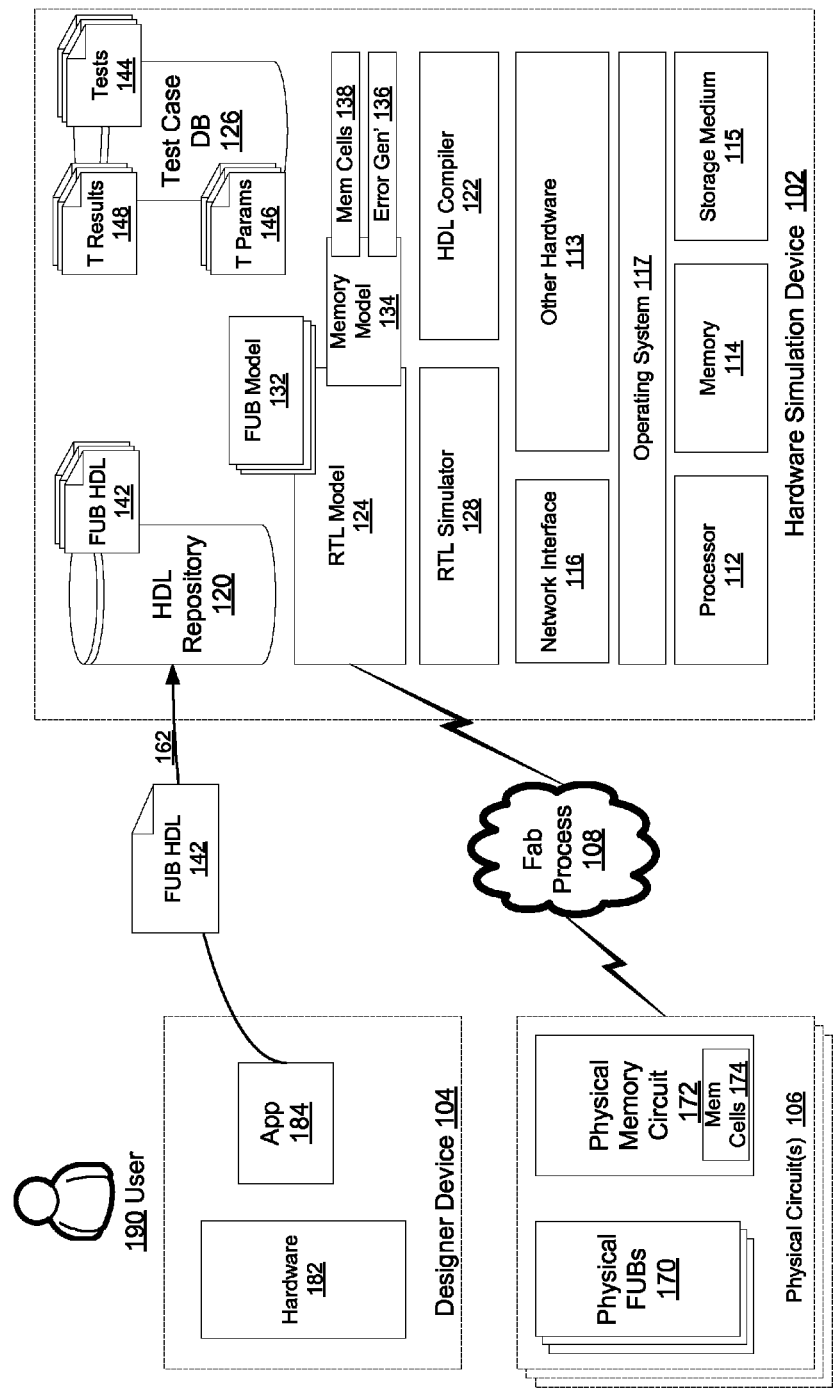
FIG. 1 is a block diagram of an example embodiment of a system in accordance with the disclosed subject matter.

FIG. 1 is a block diagram of an example embodiment of a system 100 in accordance with the disclosed subject matter. In one embodiment, the system 100 may include a computing or hardware simulation device 102. However, in various embodiments, the system 100 may also include a designer device 104 operated by a user or logic/circuit designer 190. In the illustrated embodiment, the hardware simulation device 102 may be used to validate or simulate an electrical circuit prior to or as part of the process of turning circuit design (created by the user 190) into a physical circuit 106.

In various embodiments, the hardware simulation device 102 may include a computing device, such as, for example, a shared computing terminal, a desktop personal computer, a laptop, a netbook, a tablet, a smartphone, etc. or a virtual machine thereof. In various embodiments, the hardware simulation device 102 may be used by a user (not shown). In various embodiments, the hardware simulation device 102 may include a processor 112 configured to execute one or more machine executable instructions or pieces of software, firmware, or a combination thereof. The hardware simulation device 102 may include, in some embodiments, a memory 114 configured to store one or more pieces of data, either temporarily, permanently, semi-permanently, or a combination thereof. Further, the memory 114 may include volatile memory, non-volatile memory or a combination thereof. In various embodiments, the hardware simulation device 102 may include a storage medium 115 configured to store data in a semi-permanent or substantially permanent form. In various embodiments, the storage medium 115 may be included by the memory 114.

In various embodiments, the hardware simulation device 102 may include one or more network interfaces 116 configured to allow the hardware simulation device 102 to be part of and communicate via a communications network (not shown). Examples of a Wi-Fi protocol may include, but are not limited to: Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to: IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

In various embodiments, the hardware simulation device 102 may include one or more other hardware components 113 (e.g., a display or monitor, a keyboard, a mouse, a camera, a fingerprint reader, a video processor, etc.). It is understood that the above are merely a few illustrative examples to which the disclosed subject matter is not limited.

In various embodiments, the hardware simulation device 102 may include an operating system (OS) 117 configured to provide one or more services to an application (e.g., HDL Compiler 112, RTL Simulator 124, etc.) and manage or act as an intermediary between the application and the various hardware components (e.g., the processor 112, a network interface 116, etc.) of the hardware simulation device 102. In such an embodiment, the hardware simulation device 102 may include one or more native applications, which may be installed locally (e.g., within the storage medium 115, etc.) and configured to be executed directly by the processor 112 and directly interact with the OS 117. In such an embodiment, the native applications may include pre-compiled machine executable code. In some embodiments, the native applications may include a script interpreter (e.g., C shell (csh), AppleScript, AutoHotkey, etc.) or a virtual machine (e.g., the Java Virtual Machine, the Microsoft Common Language Runtime, etc.) that are configured to translate source or object code into executable code which is then executed by the processor 112.

In one embodiment, the OS 117 may allow the application access to various system resources (e.g., access to the storage medium 116, access to a camera, access to a location sensor, draw a user interface (UI) on a display/monitor, etc.) to perform various application functions (e.g., contact a web site, take a picture, read/write a file, etc.).

In one embodiment, the system 100 may include one or more designer device 104. These designer devices 104 may include a computing device, such as, for example, a shared computing terminal, a desktop personal computer, a laptop, a netbook, a tablet, a smartphone, etc. or a virtual machine thereof. In such an embodiment, the designer device 104 may include a plurality of hardware components 182 such as those described above in reference to the hardware simulation device 102 (e.g., processor, memory, network interface, etc.).

In various embodiments, the designer device 104 may be operated or used by a user 190 or more specifically a logic or circuit design 190 whose job is to design or create an electrical circuit, in whole or part. In the illustrated embodiment, the designer 190 will be illustrated as designing a portion of a physical circuit 106. In this context, that portion of the physical circuit 106 may be referred to as a logical functional unit block (FUB) and includes an execution unit or group of electrical sub-circuits (e.g., NAND gate, flip-flop, etc.) that performs one or more operations on a given set of input electrical signals and produces a given set of output electrical signals.

In various embodiments, the FUB may include, for example, an arithmetic logic unit (ALU), a floating-point unit (FPU) and a Single Instruction, Multiple Data Unit (SIMD), etc. It is understood that while the traditional textbook processor pipeline may have five pipe stages (Instruction fetch, Instruction decode, Execute, Memory access, and Write back) that the term "execution unit" or FUB, in this context is not limited only to units involved in the execute pipe stage. In the illustrated embodiment, the discussed FUBs may be generally divided into two categories: Memory FUBs that include memory portions (e.g., registers, caches, etc.) and Non-Memory FUBs that make use of (e.g., read from, write to, etc.) FUBs that include memory portions. For example, an Instruction Fetch FUB (non-memory) may read data from an Instruction Cache FUB (memory). It is understood that this categorization is for purposes of illustrative simplification and more complex categories are possible. It is also understood that the above are merely a few illustrative examples to which the disclosed subject matter is not limited.

In such an embodiment, the designer 190 may write or edit the source code for a given FUB using an HDL. In this context, the source code may be referred to as the HDL FUB 142. In various embodiments, the designer 190 may use an application 184 (e.g., integrated design environment, text editor, etc.) to write/edit the HDL FUB 142. In some embodiments, the designer 190 or application 184 may then transmit the HDL FUB 142 to the hardware simulation device 102 or HDL repository 120.

In the illustrated embodiment, the hardware simulation device 102 (or another device) may include a repository or database (DB) 120 of the HDL source code or FUB HDLs 142 written by various designers 190 that describe the electrical circuit that will become the physical circuit 106 or the design of the electrical circuit at a given point (e.g., at an intermediate point in the circuit's design, etc.). As described above, this HDL repository 120 may be stored of a different device (e.g., a file server, revision control tool, etc.).

In various embodiments, the hardware simulation device 102 may include an HDL compiler 122 configured to convert the HDL FUB source code 142 into an RTL model 124 of the electrical circuit. In such an embodiment, the RTL Model 124 may include one or more FUB models 132 that correspond to respective pieces of FUB HDL code 142. In the illustrated embodiment, a FUB for a Memory is specifically illustrated as Memory Model 134.

In various embodiments, the hardware simulation device 102 may include an RTL simulator 128 configured to simulate the electrical circuit based upon the RTL Model 124. In such an embodiment, my having the RTL simulator 128 excite or set various inputs of the RTL model 124 to, for example, a high or low electrical value the performance and functionality of the hardware design (as expressed in the FUB HDLs 142) may be determined. In such an embodiment, the RTL simulator 128 may be configured to read to detect the values output via the output signals of the RTL model 124. In some embodiments, the RTL simulator 128 may be configured to read or write (a.k.a. excite or set) various internal signals or nodes that are internal to the RTL model 124 and, therefore, neither an input nor an output of the RTL model 124 or the electrical circuit. In such an embodiment, the RTL simulator 128 may be configured to provide a designer 190 with a more complete view or insight into the electrical circuit than would occur if only the inputs/outputs were visible, as would occur in the physical circuit 106.

In various embodiments, the hardware simulation device 102 may include a test case database (DB) 126. In such an embodiment, the test case DB 126 may be configured to store one or more tests 144. In various embodiments, these tests 144 may indicate or include a set of input signals and values that the RTL simulator 128 is to apply to the RTL model 124 and a set of expected outputs from the RTL model 124. In various embodiments, these input/output sets may include time components (e.g., set signal 6783 high at clock cycle number 31527, etc.). In various embodiments, the test case DB 126 may include a plurality of DBs.

As described above, in various embodiments, the test 144 may be written in a HDL or another language and may need to be compiled prior to their execution. It is understood that the above is merely one illustrative example to which the disclosed subject matter is not limited.

In such an embodiment, a tester or designer 190 may cause the hardware simulation device 102 may cause the RTL simulator 128 to execute the test 144, that is excite signals of the RTL model 124 according to the test 144. In such an embodiment, the RTL simulator 128 may record the various output signals from the RTL model 124 and/or any internal signals as dictated by the test 144 or RTL simulator 128 settings. These test results 148 may be stored within the test case DB 126 or another DB.

In some embodiments, the number of tests 144 may be in the order of hundreds. However, for more aged circuit architectures (e.g., the x86 architecture which is derived from the Intel 8086 integrated circuit (IC) that was made first in 1978, etc.) the number of tests 144 may be on the order of hundreds of thousands. It is understood that the above are merely a few illustrative examples to which the disclosed subject matter is not limited.

As described above, in order to cause an RTL model 124 or memory model 134 to experience a soft error a test 144 is often written that indicates that a particular signal (e.g., signal 6783, signal named #error_detected, etc.) that is internal to the memory model 134 be set to a particular value (e.g., high, low, etc.). As described above, this traditional hard coding approach requires that every time the RTL model 124 or memory model 134 changes significantly the test 144 may need to be revised, for example, the signal 6783 may no longer exist in the RTL model 124 or have a new function such that setting the signal would have undesired effects.

In various embodiments, the RTL model 124 may employ a hierarchal naming structure for signal names. In such an embodiment, the naming structure may include a top level name (e.g., "CPU_Core_0", etc.) then a multi-FUB group level name (e.g., "data_cache_group". etc.), then a FUB name (e.g., "L0_cache_2". etc.), then a sub-FUB circuit name (e.g., "read_port_2". etc.), and finally a name of the actual signal (e.g., "#error_detected". etc.). In such an embodiment, this may allow sub-FUBs, FUBs or even grouping or multiple FUBs to be multiply instantiated within a RTL model 124 without causing conflicting signals name. For example, a multi-cored central processor unit (CPU) may have multiple instantiations of the grouping of FUBs that comprise a Core. Likewise a multi-ported memory FUB may include multiple instantiations (one for each port) of a read-port sub-FUB or circuit. In the illustrative embodiment described above, a signal's full name may represent that full hierarchy (e.g., "CPU_Core_0/data_cache_group/L0_cache_2/read_port_2/#error_detected", etc.) and would be different from a similar or essentially the same signal but in a different hierarchy branch (e.g., "CPU_Core_0/data_cache_group/L0_cache_2/read_port_0/#error_detected", etc.).

In various embodiments, such complex signal names may make tests 144 that employ hard coded signal name or explicitly cause soft errors more fragile or susceptible to changes in the RTL model 124 during the design process, as the FUB HDLs 142 are changed. It is understood that the above is merely one illustrative example to which the disclosed subject matter is not limited.

Conversely, in the illustrated embodiment, the memory model 134 may include an error injector or generator 136 portion configured to generate or inject soft errors into a memory model 134 based upon a test 144 or a set of test parameters 146, as described below. In such an embodiment, the memory model 134 may include a memory cell model 138 configured to simulate the electrical circuit within the memory FUB simulation by the memory model 134 that stores data (e.g., a bit, a byte, etc.).

In the illustrated embodiment, calls or access to this memory cell 138 may be gated by or controlled by the error generator 136. In this context, a "memory access" includes a memory operation that results in either the stored data being read from the memory cell 138 or memory model 134 or new data being stored by the memory cell 138 or memory model 134. In such an embodiment, when a test 144 or portion of the memory model 134 attempts to read and/or write data to the memory cell 138 the error generator or injector 136 may first be called or accessed. In some embodiments, the error generator 136 may be configured to determine if a soft error will occur or if the memory access (e.g., a read, a write, etc.) will occur normally or without error.

In such an embodiment, if it is determined by the error generator 136 that a memory access will occur without error, the memory cell 138 may store input data or provide the requested data correctly, as is normally done with RTL simulations. Conversely, if it is determined by the error generator 136 that a memory access will result in an error the error generator 136 may cause the memory cell 138 or the memory model 134 to store the input data incorrectly, provide data different than what is stored by the accessed memory cell 138, assert an error signal, or any combination thereof. In various embodiments, the form of the error (e.g., number of bits affected, asserting only an error signal, affecting only read memory accesses, etc.) may depend upon the embodiment of the error generator 136 or upon the test 144 and/or its associated test parameters 146.

In one example embodiment, the error generator 136 may include a function or simulated logic circuit that acts as an additional input to the accessed memory cell 138. In such an embodiment, the error generator 136 may output a 1-bit signal that indicates that an error should or should not (e.g., a Boolean true or false) be generated or returned by the memory cell 138.

In such an embodiment, when data is read (or more generally accessed) from the memory cell 138 the error generator 136 determines if an error should occur. In various embodiments, the error generator 136 may base this determination upon a number of factors. For example, the test 144 may specify one or more hierarchal names of a signals or FUB portions (e.g., Core_0/ . . . /read_port_2/*, etc.) for which an error may be generated. In such an embodiment, if the memory cell 138 being accessed is not in the correct hierarchy path or FUB-portion, the error generator 136 may not cause an error to occur.

Likewise, other parameters upon which the error generator 136 may base its decision include parameters that indicate, for example, a probability of an error occurring, a maximum or minimum number of errors to inject within a simulation or test 144, a time window (e.g., clock cycles 1000-1500, between 1000-2000 nanoseconds, etc.) in which an error is either allowed or disallowed, etc. It is understood that the above are merely a few illustrative examples to which the disclosed subject matter is not limited.

In various embodiments, these parameters may be included within one or more test parameter files 146 that are separate from, but associated with, the tests 144 themselves. In various embodiments, a test parameter file 146 may be associated with a corresponding test 144. In another embodiment, a test parameter file 146 may be associated with a plurality or group of tests 144.

In such an embodiment, the test parameter files 146 may be changed without causing the tests 144 to be recompiled. For example, if the hierarchical name of a memory cell changes 138 the test 144 need not be re-written and re-compiled. Instead, the hierarchical name may be easily changed within the associated test parameter files 146. Likewise, error probabilities, maximum number of errors, or other parameters may be changed without the need to edit the tests 144.

Also, by having an error generator model 136 associated with each memory cell 138, as opposed to each test 144 manually and explicitly setting or asserting individual electrical signals (e.g., the memory cell's 138 read port output signals, etc.), error injection or generation may occur across a wide variety of memory cells 138 or even memory models 134. In such an embodiment, the test parameters 146 may specify that errors may occur within any memory cell 138 of a particular memory model 134 (e.g., Core_0/ . . . /read_port_2/*, etc.) or even across all memory models 134 of the RTL model 124. It is understood that the above are merely a few illustrative examples to which the disclosed subject matter is not limited.

In such an embodiment, the RTL model 124, which may also be referred to as a device-under-test (DUT) may be more fully tested or functionally verified as the tests 144 may causes soft errors within more memory models 134 than would be possible with hard-coded error generation within the test 144 themselves.

In various embodiments, the error generator 136 may also be configured to provide test results 148. For example, in one embodiment, the error generator 136 may log or indicate within a test results file 148 when an error was injected or generated, what signals or signal names in the RTL model 124 where overridden with the error, the value of the error (e.g., incorrect memory read data provided, error signal asserted, etc.), and other testing results as desired. In various embodiments, the test 144 may be configured to dynamically alter its behavior if the error generator 136 has determined that an error has been detected. For example, in one embodiment, the expected results of the test 144 may be changed based upon an error being injected or not injected. It is understood that the above are merely a few illustrative examples to which the disclosed subject matter is not limited.

In the illustrated embodiment, once the RTL model 124 is judged to be substantially or sufficiently functionally verified the RTL model 124 or FUB HDLs 142 may be fabricated into a physical circuit 106. In various embodiments, this process may be referred to as a fabrication process 108 and may take many forms or embodiments. In one embodiment, the RTL model 124 or substantially equivalent model may be downloaded or burned into a programmable device, such as for example a field-programmable gate array (FPGA), application-specific integrated circuit (ASIC), or Electrically Erasable Programmable Read-Only Memory (EEPROM). In another embodiment, the RTL model 124 or substantially equivalent model may be turned into a customized integrated circuit 106 (e.g., a processor, a chipset, etc.). In some embodiments, this may include an automated design process that interprets an algorithmic description of a desired behavior and creates hardware that implements that behavior. In yet another embodiment, the fabrication process may include human hand-built circuits based upon the FUB HDL 142 descriptions. In some embodiments, the fabrication process may include a combination of one or more of the above techniques.

For example, memory FUBs and computational FUBs (e.g., floating point units, etc.) may be hand-drawn due to size or speed concerns, whereas less computational FUBs (e.g., instruction fetch, etc.) may be generated by via an automated design process, and yet other FUBs (e.g., lookup tables, etc.) may be burned into a programmable portion of the physical circuit 106. It is understood that the above is merely one illustrative example to which the disclosed subject matter is not limited.

In various embodiments, the physical circuit 106 may include an integrated circuit (IC), although the disclosed subject matter is not so limited. In some embodiments, the physical circuit 106 may include a plurality of physical FUBs 170 (e.g., Instruction Fetch FUB, FPU FUB, etc.) and one or more physical memory circuits or FUBs 172 (e.g., registers, caches, etc.). In such an embodiment, the physical s FUBs 170 may correspond with or be based upon the FUB models 132. Likewise, the physical memory circuits or FUBs 172 may be based upon or correspond with the memory models 134.

In such an embodiment, the physical memory circuit or FUBs 172 may include a physical memory cell circuit 174 that corresponds with or is based upon the memory cell models 138. However, in various embodiments, the physical memory circuit or FUB 172 may not include an error generator or injector component. In such an embodiment, the error generator or injector model 136 may be an RTL model testing construct or artifact that is not converted (via the fabrication process 108) into a physical circuit.

In one such embodiment, if the error generator model 136 provides a 1-bit input signal to the memory cell model 138 (indicating whether or not an error is to be generated), when undergoing the fabrication process 108 that 1-bit signal may be permanently set to indicate that no error is to be generated. In various embodiments, automated or customization fabrication processes 108 may result in the any logic or circuits that would never be activated due to this permanent value being optimized out of the physical circuit 172. In another embodiment, the logic or circuits that make use of this signal may still exist in the physical circuit 172, but as their input is permanently set their output may be static. It is understood that the above are merely a few illustrative examples to which the disclosed subject matter is not limited.

While the illustrated embodiment shows error injection or generation within memory FUBs, in various embodiments, the same technique of modeling or simulating various errors may be employed within or for non-memory FUBs (e.g., ALUs, FPUs, etc.). Further, while the illustrated embodiment shows error injection or generation within internal memory FUBs that are integrated with the main RTL model 124, in various embodiments, the same technique of modeling or simulating various errors may be employed for external memory models or external FUBs in general (e.g., off-chip caches, chipsets, plug-in boards, etc.). It is understood that the above is merely one illustrative example to which the disclosed subject matter is not limited.

FIG. 2 is a diagram of an example embodiment of code portion 200 for a simulated memory circuit in accordance with the disclosed subject matter. In one embodiment, the code portion 200 may include HDL source code that creates or describes a memory circuit, as described above. In various embodiments, the code portion 200 (or a more functional version thereof) may be converted into an RTL model of the memory FUB that is suitable for simulation and testing, as described above.

In one embodiment, the code portion 200 may include a portion 202 that defines the FUB or "module" as it is referred to in this HDL. In the illustrated embodiment, portion 202 defines that this memory FUB receives input signals for the clock, read enable, write enable, a 32-bit address signal(s) (4 gigibyte (GiB) address space), a 32-bit data input or write signal(s), and outputs a 32-bit data output or read signal(s), and an error signal. In the illustrated embodiment, the error signal indicates whether or not a soft error (e.g., parity error, etc.) occurred when providing the 32-bit data output or read signal(s).

In one embodiment, the code portion 200 may include a portion 204 that defines or describes the logical functions of the memory FUB. Portion 204 would include the logical descriptions of the memory cells, handling of the read and write enables, etc. as defined by whatever architectural or design specification is used for this memory FUB. The details of the FUB implementation are not relevant to the current description of the disclosed subject matter and are not illustrated.

In one embodiment, the code portion 200 may include a portion 206 that causes the FUB to dynamically determine its name or place within the hierarchy of the RTL model. As described above, FUBs may be instantiated several times (e.g., multiple cores, multiple caches, etc.) and the FUB's name within the RTL model may not be determined until the RTL model is built or simulated. As described below, the FUB's name or the names of the FUB's various signals may be used or employed to determine if an error should be generated or injected.

In one embodiment, the code portion 200 may include a portion 208 that causes the output signals of the memory FUB to be set to a particular value. In the illustrated embodiment, the output signals include the error signal ("error") and the 32-bit output or read data signal(s) ("data_out").

In one embodiment, the portion 208 may include a portion 210 that tests whether or not the error generator or injection model indicates that an error should occur when reading the data_out signal. In the illustrated embodiment, the error generator or injection model is shown as a function that takes the hierarchal name of the memory FUB as an input and provides as output a 1-bit signal that indicates whether or not an error should occur. This function is illustrates and described in more detail in FIG. 3. In various embodiments, the error injection function may be a global function or circuit that is instantiated throughout the RTL model whenever a memory FUB is used.

In the illustrated embodiment, if an error is to be injected or generated, portion 210 indicates that the error signal is to be asserted high and the 32-bit output or read data signal is to be set to some random value, instead of the actual value stored within the memory FUB. Conversely, if an error is not to be injected or generated, portion 212 indicates that the error signal is to be set low and the 32-bit output or read data signal is to be set to whatever the actual value stored within the memory FUB is (as defined by portion 204).

While a 1-bit output for the error injection function is illustrated in various embodiments, such a function or circuit may provide multiple outputs. For example, in another embodiment, the error injection circuit may output a value for the data_out signal instead of just asserting a random value. In one such embodiment, the error injection circuit may receive the value stored within the memory FUB for the given read address and alter that value according to the test parameters (e.g., change 2 bits of the value, always set bit #3 to low, etc.). It is understood that the above are merely a few illustrative examples to which the disclosed subject matter is not limited.

FIG. 3 is a diagram of an example embodiment of code portion 300 for a simulated memory circuit in accordance with the disclosed subject matter. In one embodiment, the code portion 300 may include HDL source code that creates or describes an error generation or injection portion of a memory circuit, as described above. In various embodiments, the code portion 300 may be converted into an RTL model of the memory FUB that is suitable for simulation and testing, as described above.

In one embodiment, the error generation or injection function or circuit illustrated by code portion 300 may include a parameter or variable portion 302. In the illustrated embodiment, the portion 302 may indicate values for various parameters used to determine when or if an error should be injected or generated within a memory model, as described above.

In the illustrated embodiment, the input parameters include a time window after which errors may occur, a maximum number of errors, a name or string to which FUB hierarchical names must match in order for an error to occur, and a probability that an error may occur. It is understood that the above are merely a few illustrative examples to which the disclosed subject matter is not limited. In various embodiments, one or more of these parameters may be retrieved from a test parameters file or external source. However, in the illustrated embodiment, these parameters are shown as being hard-coded into the error generation or injection function or code portion 300.

In various embodiments, the portion 302 may include definitions of any variables or signals used internally for the error generation process. For example, a variable ("tot_errors") may be used to indicate a running total of errors generated so far within the test or a variable ("en_string_match") may be used to store an intermediate determination involved with whether or not an error should be generated. It is understood that the above are merely a few illustrative examples to which the disclosed subject matter is not limited.

In one embodiment, the error generation or injection function or circuit illustrated by code portion 300 may include a determination portion 304. In such an embodiment, the code portion 304 may determine if an error should be generated or injected within a calling memory module (e.g., the memory model in FIG. 2, specifically code portion 210) and if so, generate and return the 1-bit output signal.

The error generation or injection function or circuit illustrated by code portion 300 may include an intermediate determination portion 306. In such an embodiment, the portion 306 may compare the hierarchical name provided by the calling memory model (as input "module_hierarchy") to one or more names or strings to which FUB hierarchical names must match in order for an error to occur (e.g., "match_string"). In the illustrated embodiment, the two names must be exact. However, in another embodiment, the input hierarchical name ("module_hierarchy") may be matched against a plurality of possible matching strings or hierarchical names. In yet another embodiment, the input hierarchical name ("module_hierarchy") may be matched against a hierarchical name that includes wildcards, regular expressions, or sub-portions (e.g., all instantiations of a L0 Cache may be matched, etc.).

The error generation or injection function or circuit illustrated by code portion 300 may include a final determination portion 308. In the illustrated embodiment, logical expression involving the various parameters (e.g., probability, maximum number of errors, etc.) may be checked to determine if an error should be generated. In some embodiments, a random value ("tmp_float") may be generated and checked against the probability of error parameter ("error_prob") to dynamically determine if an error should be generated. In such an embodiment, this may make the generation or injection of an error a random event as opposed to the typical deterministic error injection that results from hard-coded error injection. It is understood that the above are merely a few illustrative examples to which the disclosed subject matter is not limited.

Code portion 310 illustrates that if an error is to be injected the error generation or injection function or model may cause a log message to be output to a log or test results file, as described above. In the illustrated embodiment, a 1-bit value may be the result of the generation or injection function or the output from a circuit that indicates an error should occur. As described above, in one embodiment, this 1-bit intermediate signal may be used as an input signal to a memory circuit.

Code portion 312 illustrates that if an error is not to be injected the error generation or injection function or model may refrain from writing a log message a log or test results file, as described above. In the illustrated embodiment, a 1-bit value may be the result of the generation or injection function or the output from a circuit that indicates an error not should occur. As described above, in one embodiment, this 1-bit intermediate signal may be used as an input signal to a memory circuit.

In various embodiments, the log message may include the simple indication that an error was injected. However, in another embodiment, the log message may include one or more indicators of the following: exactly in which memory or model hierarchical signals the error was generated, the memory address accessed, the time (e.g., clock cycles, milliseconds, etc.) at which the error was generated, the form the error took (e.g., a corruption of data, an assertion of an error signal, etc.), the data as it would have been without error, the data as it was provided with the error included, etc. It is understood that the above are merely a few illustrative examples to which the disclosed subject matter is not limited.

As described above, in various embodiments, the error generation or injection function or circuit may dynamically retrieve parameter values from an external file (e.g., test parameter file, the test itself, etc.). In various embodiments, the error generation or injection function or circuit may not only output a 1-bit signal but instead output the error value, alter the output value, output a more complex error signal, etc. It is understood that the above are merely a few illustrative examples to which the disclosed subject matter is not limited.

FIG. 4 is a flow chart of an example embodiment of a technique in accordance with the disclosed subject matter. In various embodiments, the technique 400 may be used or produced by the systems such as those of FIG. 1, 2, or 3. Although, it is understood that the above are merely a few illustrative examples to which the disclosed subject matter is not limited. It is understood that the disclosed subject matter is not limited to the ordering of or number of actions illustrated by technique 400.

Block 402 illustrates that, in one embodiment, a circuit that includes a memory or a memory circuit may be simulated, as described above. In various embodiments, one or more of the action(s) illustrated by this Block may be performed by the apparatuses or systems of FIG. 1, the RTL simulator 128, RTL Model 124 and/or memory model 134 of FIG. 1, or the code portions of FIG. 2 or 3, as described above.

Block 404 illustrates that, in one embodiment, the simulated memory circuit may receive a memory access operation, as described above. In one embodiment, the memory access operation may include a read and/or a write memory access operation, as described above. In various embodiments, one or more of the action(s) illustrated by this Block may be performed by the apparatuses or systems of FIG. 1, the RTL simulator 128, RTL Model 124 and/or memory model 134 of FIG. 1, or the code portions of FIG. 2 or 3, as described above.

Block 406 illustrates that, in one embodiment, it may be dynamically determining if the simulated memory circuit should generate a memory error as the result of the memory access, as described above. In various embodiments, this determination may be based upon one or more predefined testing criteria, as described above. In some embodiments, the predefined criteria may include a set of predefined criteria that are stored externally from the simulated memory circuit or a test and may be edited without re-compiling the simulated memory circuit or the test, as described above.

In various embodiments, the simulated memory circuit may include at least one hierarchal memory circuit name, as described above. In such an embodiment, dynamically determining may include comparing the hierarchal memory circuit name to the predefined criteria to determine if the predetermined criteria indicate that the simulated memory circuit may possibly generate a memory error, as described above.

In one embodiment, the predefined criteria may define an error time window in which memory errors may be generated, as described above. In such an embodiment, dynamically determining may include comparing a time value associated with simulating the simulated memory circuit to the predefined criteria to determine if the predetermined criteria indicate that the simulated memory circuit may possibly generate a memory error during the time value, as described above.

In another embodiment, the predefined criteria may define an error probability that includes a probability that a memory error may be generated, as described above. In such an embodiment, dynamically determining may include generating a random value, and determining, based on the error probability, if the random value indicates that a memory error is to be generated, as described above.

In yet another embodiment, the predefined criteria may define a plurality of error probabilities, each associated with one or more portions of the simulated memory circuit, as described above. In such an embodiment, dynamically determining may include determining, based upon the memory access, which portion of the simulated memory circuit the memory access is associated with, retrieving the respective error probability associated with the portion of the simulated memory circuit the memory access is associated with, and generating a random value, and determining, based on the error probability, if the random value indicates that a memory error is to be generated, as described above.

In various embodiments, dynamically determining includes generating a 1-bit signal that indicates whether or not the simulated memory circuit should generate a memory error, as described above. In various embodiments, one or more of the action(s) illustrated by this Block may be performed by the apparatuses or systems of FIG. 1, the RTL simulator 128, RTL Model 124 and/or memory model 134 or error generator or injector 136 of FIG. 1, or the code portions of FIG. 2 or 3, as described above.

Block 408 illustrates that, in one embodiment, if the simulated memory circuit is to generate the memory error, the memory error may be generated as the result of the memory access, as described above. In some embodiments, generating the memory error includes asserting a memory error signal but not altering the data associated with the memory access, as described above. In various embodiments, one or more of the action(s) illustrated by this Block may be performed by the apparatuses or systems of FIG. 1, the RTL simulator 128, RTL Model 124 and/or memory model 134, the memory cell model 138, or error generator or injector 136 of FIG. 1, or the code portions of FIG. 2 or 3, as described above.

Block 410 illustrates that, in one embodiment, if the simulated memory circuit is to generate the memory error, a log entry may be created or generated indicating that the memory error was generated, as described above. In various embodiments, one or more of the action(s) illustrated by this Block may be performed by the apparatuses or systems of FIG. 1, the RTL simulator 128, RTL Model 124 and/or memory model 134, the memory cell model 138, test results 148, or the error generator 136 of FIG. 1, or the code portions of FIG. 2 or 3, as described above.

Block 412 illustrates that, in one embodiment, if the simulated memory circuit is not to generate the memory error, the memory access may be performed without error, as described above. In various embodiments, one or more of the action(s) illustrated by this Block may be performed by the apparatuses or systems of FIG. 1, the RTL simulator 128, RTL Model 124 and/or memory model 134, the memory cell model 138, or the error generator 136 of FIG. 1, or the code portions of FIG. 2 or 3, as described above.

Figure 5:
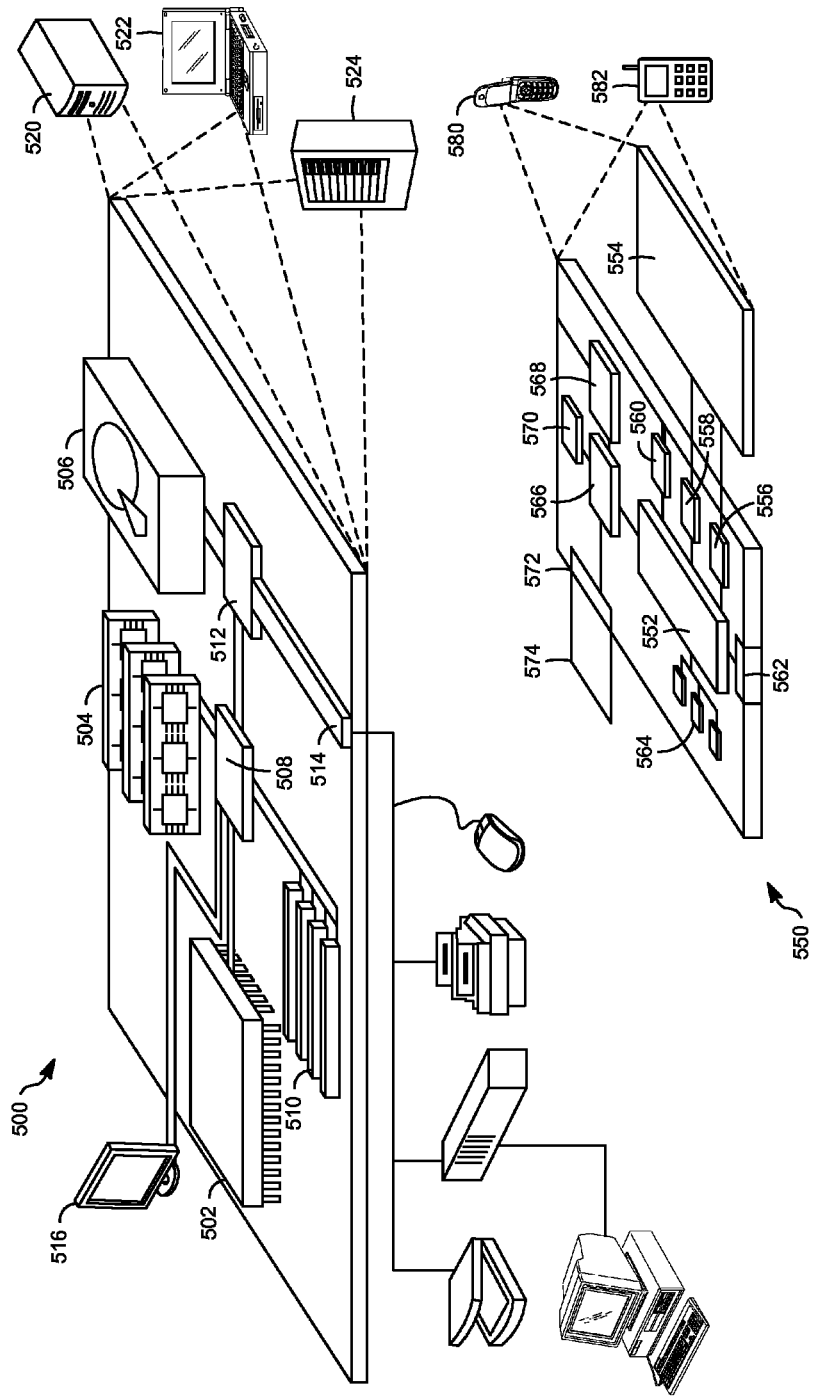
FIG. 5 shows an example of a computer device and a mobile computer device that can be used to implement the techniques described here.

FIG. 5 shows an example of a generic computer device 500 and a generic mobile computer device 550, which may be used with the techniques described here. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a volatile memory unit or units. In another implementation, the memory 504 is a non-volatile memory unit or units. The memory 504 may also be another form of computer-readable medium, such as a magnetic or optical disk.

The storage device 506 is capable of providing mass storage for the computing device 500. In one implementation, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of functions is exemplary only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can execute instructions within the computing device 550, including instructions stored in the memory 564. The processor may be implemented as a chipset of chips that include separate and multiple analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD (Thin-Film-Transistor Liquid Crystal Display) or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provide in communication with processor 552, so as to enable near area communication of device 550 with other devices. External interface 562 may provide, for example, for wired communication in some implementations, or for wireless communication in other implementations, and multiple interfaces may also be used.

The memory 564 stores information within the computing device 550. The memory 564 can be implemented as one or more of a computer-readable medium or media, a volatile memory unit or units, or a non-volatile memory unit or units. Expansion memory 574 may also be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provide as a security module for device 550, and may be programmed with instructions that permit secure use of device 550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552, that may be received, for example, over transceiver 568 or external interface 562.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS (Global Positioning System) receiver module 570 may provide additional navigation- and location-related wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smart phone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A computer-implemented method comprising:
   simulating, by a computing device, a memory circuit, the memory circuit that is being simulated being configured to store data;
   receiving, by the simulated memory circuit in the computing device, a memory access operation;
   dynamically determining, by the computing device in response to the memory access operation, based on a set of predefined criteria, whether the simulated memory circuit should generate a memory error as a result of the memory access operation, the predefined criteria including an error probability defining a probability that a memory error may be generated, the dynamically determining including generating a random value and determining, based on the error probability, if the random value indicates that a memory error is to be generated; and
   in the event the simulated memory circuit is to generate the memory error, generating, by the computing device, the memory error as a result of the memory access operation.

2. The computer-implemented method of claim 1, wherein the predefined criteria further includes a set of predefined criteria that are stored externally from the simulated memory circuit and may be edited without re-compiling the simulated memory circuit.

3. The computer-implemented method of claim 1, wherein the simulated memory circuit includes at least one hierarchal memory circuit name, the dynamically determining including comparing the hierarchal memory circuit name to the predefined criteria to determine if the predefined criteria indicate that the simulated memory circuit may generate the memory error.

4. The computer-implemented method of claim 1, wherein the predefined criteria further includes an error time window that defines a time period during which memory errors may be generated, the dynamically determining including comparing a time value associated with the simulating to the predefined criteria to determine if the predefined criteria indicate that the simulated memory circuit may generate the memory error during the time period defined by the error time window.

5. The computer-implemented method of claim 1, wherein the error probability is a first error probability, the predefined criteria including a plurality of error probabilities that includes the first error probability, each of the plurality of error probabilities being associated with one or more portions of the simulated memory circuit,
   the dynamically determining including:
      determining, based on the memory access operation, a portion of the one or more portions of the simulated memory circuit the memory access operation is associated with,
      retrieving an error probability of the plurality of error probabilities, the retrieved error probability corresponding with the portion of the simulated memory circuit the memory access operation is associated with, and
      generating a random value, and determining, based on the retrieved error probability, if the random value indicates that the memory error is to be generated.

6. The computer-implemented method of claim 1, further comprising:
   in the event the simulated memory circuit is to generate the memory error, generating a log entry indicating that the memory error was generated.

7. The computer-implemented method of claim 1, wherein the dynamically determining includes generating a 1-bit signal that indicates whether the simulated memory circuit should generate the memory error.

8. The computer-implemented method of claim 1, wherein the generating the memory error includes corrupting a set of data associated with the memory access operation.

9. An apparatus comprising:
a processor configured to:
- simulate a memory circuit, the memory circuit that is being simulated being configured to store data,
- execute a test that causes the simulated memory circuit to receive a memory access operation,
- dynamically determine, in response to the memory access operation, based on a set of predefined criteria, whether the simulated memory circuit should generate a memory error as the result of the memory access operation, the predefined criteria including an error probability defining a probability that a memory error may be generated, the dynamically determining including generating a random value and determining, based on the probability, whether the random value indicates that a memory error is to be generated, and
- in the event the simulated memory circuit is to generate the memory error, generate the memory error as a result of the memory access operation; and a storage medium configured to:
- store a plurality of tests, each test of the plurality of tests being configured to cause the processor to simulate performing at least one corresponding memory access operation on the simulated memory circuit.

10. The apparatus of claim 9, wherein the predefined criteria includes a set of predefined criteria that are stored within the storage medium, are associated with a respective test of the plurality of tests, and may be edited without editing the respective test.

11. The apparatus of claim 9, wherein the simulated memory circuit includes at least one hierarchal memory circuit name, the processor being further configured to compare the hierarchal memory circuit name to the predefined criteria to determine whether the predefined criteria indicate that the simulated memory circuit may generate a memory error.

12. The apparatus of claim 9, wherein the predefined criteria further includes an error time window that defines a time period during which memory errors may be generated, the processor being further configured to compare a time value associated with the simulating to the predefined criteria to determine if the predefined criteria indicate that the simulated memory circuit may generate the memory error during the time period defined by the error time window.

13. The apparatus of claim 9, wherein the error probability is a first error probability, the predefined criteria including a plurality of error probabilities that includes the first error probability, each of the plurality of error probabilities being associated with one or more portions of the simulated memory circuit,
the processor being further configured to:
- determine, based on the memory access operation, a portion of the one or more portions of the simulated memory circuit the memory access operation is associated with,
- retrieve an error probability of the plurality of error probabilities, the retrieved error probability corresponding with the portion of the simulated memory circuit the memory access operation is associated with, and
- generate a random value, and determine, based on the retrieved error probability, if the random value indicates that the memory error is to be generated.

14. The apparatus of claim 9, wherein the processor is further configured to:
- in the event the simulated memory circuit is to generate the memory error, generate a log entry indicating that the memory error was generated.

15. The apparatus of claim 9, wherein the processor is further configured to simulate generating a 1-bit signal that indicates whether the simulated memory circuit should generate the memory error.

16. The apparatus of claim 9, wherein the processor is further configured to generate the memory error by asserting a memory error signal without altering data associated with the memory access operation.

17. A computer-implemented method comprising:
- simulating, by a computing device, a memory circuit, the memory circuit that is being simulated being configured to store data;
- receiving, by the simulated memory circuit in the computing device, a memory access operation;
- dynamically determining, by the computing device in response to the memory access operation, based on a set of predefined criteria, whether the simulated memory circuit should generate a memory error as a result of the memory access operation; and
- in the event the simulated memory circuit is to generate the memory error, generating, by the computing device, the memory error as a result of the memory access operation, the predefined criteria including a plurality of error probabilities, each of the plurality of error probabilities being associated with one or more portions of the simulated memory circuit,
the dynamically determining including:
- determining, based on the memory access operation, a portion of the one or more portions of the simulated memory circuit the memory access operation is associated with,
- retrieving an error probability of the plurality of error probabilities, the retrieved error probability corresponding with the portion of the simulated memory circuit the memory access operation is associated with, and
- generating a random value, and determining, based on the retrieved error probability, if the random value indicates that the memory error is to be generated.

18. The computer-implemented method of claim 17, wherein the predefined criteria further includes a set of predefined criteria that are stored externally from the simulated memory circuit and may be edited without re-compiling the simulated memory circuit.

19. The computer-implemented method of claim 17, wherein the simulated memory circuit includes at least one hierarchal memory circuit name, the dynamically determining including comparing the hierarchal memory circuit name to the predefined criteria to determine if the predefined criteria indicate that the simulated memory circuit may generate the memory error.

20. The computer-implemented method of claim 17, wherein the predefined criteria further includes an error time window that defines a time period during which memory errors may be generated, the dynamically determining including comparing a time value associated with the simulating to the predefined criteria to determine if the predefined criteria indicate that the simulated memory circuit may generate the memory error during the time period defined by the error time window.

21. The computer-implemented method of claim 17, further comprising:
in the event the simulated memory circuit is to generate the memory error, generating a log entry indicating that the memory error was generated.

22. The computer-implemented method of claim 17, wherein the dynamically determining includes generating a 1-bit signal that indicates whether the simulated memory circuit should generate the memory error.

23. The computer-implemented method of claim 17, wherein the generating the memory error includes corrupting a set of data associated with the memory access operation.

24. An apparatus comprising:
a processor configured to:
simulate a memory circuit, the memory circuit that is being simulated being configured to store data,
execute a test that causes the simulated memory circuit to receive a memory access operation,
dynamically determine, in response to the memory access operation, based on a set of predefined criteria, whether the simulated memory circuit should generate a memory error as a result of the memory access operation, and
in the event the simulated memory circuit is to generate the memory error, generate the memory error as a result of the memory access operation; and
a storage medium configured to:
store a plurality of tests, each test of the plurality of tests being configured to cause the processor to simulate performing at least one corresponding memory access operation on the simulated memory circuit,
the predefined criteria including a plurality of error probabilities, each of the plurality of error probabilities being associated with one or more portions of the simulated memory circuit,
the processor being further configured to:
determine, based on the memory access operation, a portion of the one or more portions of the simulated memory circuit the memory access operation is associated with,
retrieve an error probability of the plurality of error probabilities, the retrieved error probability corresponding with the portion of the simulated memory circuit the memory access operation is associated with, and
generate a random value, and determine, based on the retrieved error probability, if the random value indicates that the memory error is to be generated.

25. The apparatus of claim 24, wherein the predefined criteria further includes a set of predefined criteria that are stored within the storage medium, are associated with a respective test of the plurality of tests, and may be edited without editing the respective test.

26. The apparatus of claim 24, wherein the simulated memory circuit includes at least one hierarchal memory circuit name, the processor being further configured to compare the hierarchal memory circuit name to the predefined criteria to determine whether the predefined criteria indicate that the simulated memory circuit may generate the memory error.

27. The apparatus of claim 24, wherein the predefined criteria further includes an error time window that defines a time period during which memory errors may be generated, the processor being further configured to compare a time value associated with the simulating to the predefined criteria to determine if the predefined criteria indicate that the simulated memory circuit may generate the memory error during the time period defined by the error time window.

28. The apparatus of claim 24, wherein the processor is further configured to:
in the event the simulated memory circuit is to generate the memory error, generate a log entry indicating that the memory error was generated.

29. The apparatus of claim 24, wherein the processor is further configured to simulate generating a 1-bit signal that indicates whether the simulated memory circuit should generate the memory error.

30. The apparatus of claim 24, wherein the processor is further configure to generate the memory error by asserting a memory error signal without altering data associated with the memory access operation.

* * * * *

UNITED STATES PATENT AND TRADEMARK OFFICE
CERTIFICATE OF CORRECTION

PATENT NO.         : 8,595,680 B1                                    Page 1 of 1
APPLICATION NO.    : 13/524390
DATED              : November 26, 2013
INVENTOR(S)        : Daniel R. Steinberg It is certified that error appears in the above-identified patent and that said Letters Patent is hereby corrected as shown below:

In the Claims

In column 22, line 38, in claim 30, delete "configure" and insert -- configured --, therefor.

Signed and Sealed this
Twenty-second Day of April, 2014

Michelle K. Lee
*Deputy Director of the United States Patent and Trademark Office*